(12) United States Patent
Zhang et al.

(10) Patent No.: US 8,431,951 B2
(45) Date of Patent: Apr. 30, 2013

(54) OPTOELECTRONIC DEVICES WITH LAMINATE LEADLESS CARRIER PACKAGING IN SIDE-LOOKER OR TOP-LOOKER DEVICE ORIENTATION

(75) Inventors: Xianzhu Zhang, Pointe-Claire (CA); Arthur Barlow, Four Marks (GB); Jerry Deleon, San Fernando (PH); Juergen Schliz, Niedernhausen (DE)

(73) Assignee: Excelitas Canada, Inc., Vaudreuil-Dorion (CA)

( * ) Notice: Subject to any disclaimer, the term of this patent is extended or adjusted under 35 U.S.C. 154(b) by 456 days.

(21) Appl. No.: 12/572,074

(22) Filed: Oct. 1, 2009

(65) Prior Publication Data

US 2011/0079801 A1  Apr. 7, 2011

(51) Int. Cl.
*H01L 33/00*  (2010.01)

(52) U.S. Cl.
USPC ............... 257/99; 257/432; 257/433

(58) Field of Classification Search .............. None
See application file for complete search history.

(56) References Cited

U.S. PATENT DOCUMENTS

| | | |
|---|---|---|
| 5,035,483 A | 7/1991 | Waitl et al. |
| 6,571,466 B1 | 6/2003 | Glenn et al. |
| 6,753,600 B1 * | 6/2004 | Ho .................................. 257/698 |
| 2009/0230420 A1 | 9/2009 | Bogner et al. |
| 2012/0213239 A1 | 8/2012 | Ju et al. |

FOREIGN PATENT DOCUMENTS

EP  1876653 A2  1/2008

OTHER PUBLICATIONS

International Search Report and Written Opinion received for PCT Patent Application No. PCT/GB2010/001825, mailed on Jan. 12, 2011, 12 pages.

* cited by examiner

*Primary Examiner* — Thien F Tran
(74) *Attorney, Agent, or Firm* — Peter A. Nieves; Sheehan Phinney Bass + Green PA (57) ABSTRACT

A laminate leadless carrier package comprising an optoelectronic chip, a substrate supporting the chip, the substrate comprising a plurality of conductive and dielectric layers; a wire bond coupled to the optoelectronic chip and a wire bond pad positioned on the top surface of the substrate; an encapsulation covering the optoelectronic chip, the wire bond, and at least a portion of the top surface of the substrate, wherein the encapsulation is a molding compound; and wherein the package is arranged to be mounted as a side-looker. A process for manufacturing laminate leadless carrier packages, comprising preparing a substrate; applying epoxy adhesive to a die attach pad; mounting an optoelectronic chip on the die attach pad; wire-bonding the optoelectronic chip; molding a molding compound to form an encapsulation covering the optoelectronic chip, a wire bond, and the top surface of the substrate; and dicing the substrate into individual packages.

18 Claims, 14 Drawing Sheets

OPTOELECTRONIC DEVICES WITH LAMINATE LEADLESS CARRIER PACKAGING IN SIDE-LOOKER OR TOP-LOOKER DEVICE ORIENTATION

BACKGROUND

1. Field

The present invention relates generally to optoelectronic packages, and more particularly to optoelectronic packages having improved features and a process for manufacturing the same.

2. Related Art

Optoelectronic devices are electrical-to-optical or optical-to-electrical transducers that convert electrical signals into photon signals, and vice versa. Some optoelectronic devices are light emitters, such as lasers and light-emitting diodes (LEDs), while others are photodetectors or sensors of light. For example, a photodiode is a photodetector capable of converting light into either current or voltage, and a phototransistor is a bipolar transistor with its base-collector junction sensitive to light. A PIN photodiode is a photodetector with a wide, near intrinsic, light absorption semiconductor layer sandwiched between P and N contact regions. An avalanche photodiode (APD) is a photodetector that shows an internal current gain when a high reverse bias voltage is applied to it; the internal current gain is due to impact ionization or the avalanche effect. APDs working in the so-called Geiger or Photomultiplier mode, often referred to as SiPMs, also fall under this category. Typical applications for PINs and APDs are long range fiber optic telecommunications and laser rangefinders, i.e., devices that use a laser beam to determine the distance to a reflective object.

The integration and packaging of semiconductor optoelectronic devices share many common challenges with its counterparts in integrated circuits (ICs) and microelectromechanical systems (MEMs), such as electrical, thermal, and stress issues. Optoelectronic devices also have some unique characteristics and thus face some unique challenges.

With regard to integration and design characteristics, most optoelectronic devices have a large active area, with feature dimensions up to a few centimeters, and their functional layer depth may be as thick as the chip or the wafer: up to a few hundred microns. In most cases, the contacts are on both the front and back sides of the device. For PIN and APD devices, the supply voltage may be as high as a few hundred volts. In general, optoelectronic devices may need optical coupling and/or blocking capabilities, such as anti-reflection coating and filtering. In addition, the integration and packaging of optoelectronic devices generally require precise mechanical dimensions and alignment, an optical coating or encapsulation that is transparent at the wavelength(s) of interest, suitable optics (e.g., lenses), and a surface finish on the encapsulating material.

The challenges of integration and packaging of optoelectronic devices include low throughput assembly lines, small wafer sizes, and the need to integrate heterogeneous semiconductors onto a single device. The assembly lines for optoelectronic devices run at relatively low throughput; for example, ten thousand parts per year may be considered as volume production. In general, production orders may range from a few devices to a few thousand devices. The wafer size for optoelectronic devices are small compared to ICs. For example, wafer processing lines for optoelectronic devices run 2" to 6" wafers, which are small compared with the 6" to 12" wafers used in the IC industry. Another challenge is to integrate heterogeneous semiconductors, such as group IV (silicon) semiconductors and group III-V semiconductors, into a single device.

Optoelectronic devices are considered as specialty items compared to ICs in the semiconductor industry. However, optoelectronic devices also face cost reduction pressure from both commercial and military market segments.

In the present invention, improved features of optoelectronic devices are disclosed. In addition, a matrix assembly technology is disclosed to meet the market demand for low cost, high volume, miniaturized, and surface-mount technology (SMT) compatible optoelectronic products.

SUMMARY

According to a first aspect of the invention there is provided a laminate leadless carrier package, comprising an optoelectronic chip, a substrate supporting the optoelectronic chip, the substrate comprising a plurality of conductive and dielectric layers laminated together; a wire bond pad positioned on the top surface of the substrate; a wire bond coupled to the optoelectronic chip and the wire bond pad; an encapsulation covering the optoelectronic chip, the wire bond, and at least a portion of the top surface of the substrate, wherein the encapsulation is a molding compound; and wherein the laminate leadless carrier package is mounted as a side-looker. In another example, the laminate leadless carrier package may be mounted as a top-looker or a side-looker. In some examples, the optoelectronic chip is supported by the substrate without a lead-frame.

The plurality of conductive and dielectric layers may include a bottom conductive layer, a top conductive layer, and a dielectric layer between the top and bottom conductive layers. The package may further comprise a plurality of conductive vias providing electrical connections between the top conductive layer and the bottom conductive layer. The top conductive layer may include a die attach pad, and the optoelectronic chip may be adhered to the die attach pad. The wire bond pad may be a portion of the top conductive layer. The top conductive layer may include two slotted vias for soldering the top conductive layer to mounting pads on a printed circuit board.

In some examples, the molding compound has low ionic content. In some examples, the molding compound has high moisture resistance. In some examples, the molding compound is optically transparent. In some examples, the molding compound filters light at particular wavelengths.

In some examples, the encapsulation provides protection without putting high stress to the wire bond. The encapsulation may cover the entire top surface of the substrate. In some examples, the top surface of the encapsulation is molded as an "optically flat" surface. In some examples, the top surface of the encapsulation is molded as a lens. The lens may be a cylindrical lens, a spherical lens, an aspherical lens, a dome-shaped lens, a torroidal lens, or any other optical component. The encapsulation may further comprise a footing for stabilizing the optoelectronic package when mounted as a side-looker.

The optoelectronic chip may be a laser, a light-emitting-diode (LED), a photodiode, a phototransistor, a PIN photodiode, an avalanche photodiode (APD), a silicon photomultiplier (SiPM), or any other optical detector chip. The substrate may be selected from the group consisting of thin film ceramic substrates, thick film ceramic substrates, and printed circuit boards of any suitable material.

According to a second aspect of the invention there is provided a process for manufacturing a plurality of laminate leadless carrier packages, comprising preparing a substrate, wherein preparing the substrate comprises laminating a top conductive layer, a bottom conductive layer, and a dielectric layer between the top and bottom conductive layers together, and wherein the top conductive layer comprises a die attach pad, a wire bond pad, and two slotted vias; applying epoxy adhesive to the die attach pad; mounting an optoelectronic chip on the die attach pad; wire-bonding the optoelectronic chip with the wire bond pad using a wire bond; molding a molding compound to form an encapsulation and/or optics covering the optoelectronic chip, the wire bond, and at least a portion of the top surface of the substrate; and dicing the substrate into individual laminate leadless carrier packages.

Preparing the substrate may further comprise preparing a plurality of conductive vias providing electrical connections between the top conductive layer and the bottom conductive layer. Preparing the substrate may further comprise providing a plurality of slotted vias on the top conductive layer for soldering the top conductive layer to mounting pads on a printed circuit board.

In some examples, molding the molding compound does not put high stress to the wire bond. Molding the molding compound may further comprise molding the top surface of the encapsulation as a flat surface. Molding the molding compound may further comprise molding the top surface of the encapsulation as a lens. The lens may be selected from the group consisting of a cylindrical lens, a spherical lens, a torroidal lens, an aspherical lens, and a dome-shaped lens. Molding the molding compound may further comprise molding a footing for stabilizing the optoelectronic package when mounted as a side-looker.

BRIEF DESCRIPTION OF THE FIGURES

The present application can be best understood by reference to the following description taken in conjunction with the accompanying drawing figures, in which like parts may be referred to by like numerals.

DETAILED DESCRIPTION

The following description is presented to enable a person of ordinary skill in the art to make and use the invention, and is provided in the context of particular applications and their requirements. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

While the invention is described in terms of particular examples and illustrative figures, those of ordinary skill in the art will recognize that the invention is not limited to the examples or figures described. Those skilled in the art will recognize that the operations of the various embodiments may be implemented using hardware, software, firmware, or combinations thereof, as appropriate.

Figure 1:
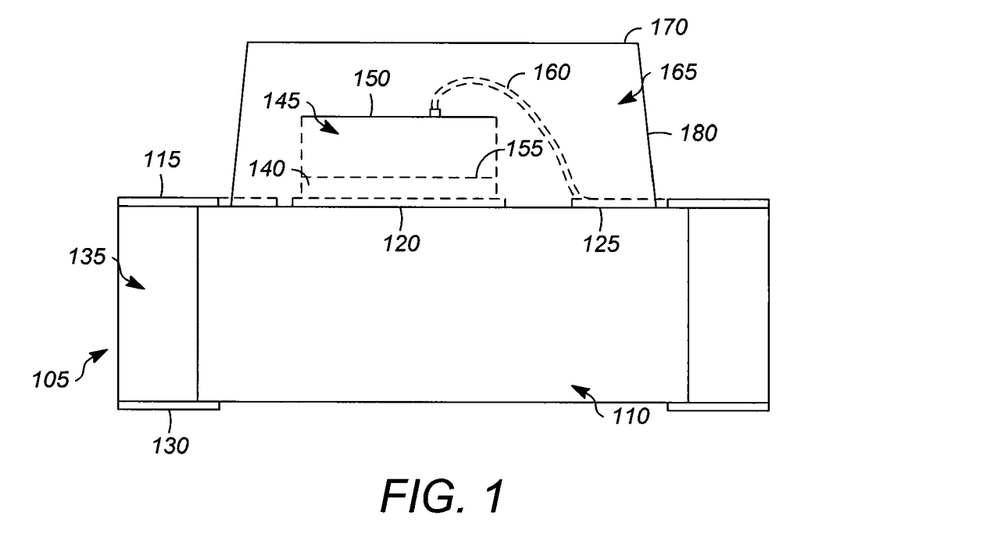
FIG. 1 illustrates a cross-sectional view of an exemplary optoelectronic package 100 in accordance with the present invention.

FIG. 1 illustrates a cross-sectional view of an exemplary optoelectronic package 100 in accordance with the present invention. The optoelectronic package 100 comprises a substrate 105, a chip 145, and an encapsulation 165.

Chip 145 may be any optoelectronic device, including lasers, LEDs, photodiodes, phototransistors, PINs, APDs, SiPMs, and the like. For example, chip 145 may be an APD chip formed of any appropriate material, such as group IV (silicon) semiconductors and group III-V semiconductors. The APD chip may have any structure, such as an epitaxial wafer (EPI) or a reach-through structure.

The optoelectronic package 100 may be a laminate leadless carrier (LLC). A leadless carrier uses flat metal pads that make contact with a printed circuit board. There are no pins extending out of the package and it may be mounted on the printed circuit board directly. A laminate chip carrier comprises multiple layers of conductive and dielectric layers laminated together. In one example, the laminate leadless carrier includes a top conductive layer and a bottom conductive layer with a dielectric layer between, as described in greater detail below. Depending on the complexity of the design, it may have many different conductive and/or dielectric layers.

The optoelectronic package 100 includes a substrate 105 for supporting chip 145. The substrate 105 may be, but is not limited to, any thin film ceramic substrates, thick film ceramic substrates, and different kinds of printed circuit boards (PCBs). In one preferred embodiment, the optoelectronic package 100 does not include any lead-frame. The substrate 105 may include a dielectric layer 110, a top conductive layer 115 and a bottom conductive layer 130 which are provided above and below the dielectric layer 110 respectively, and a plurality of conductive vias 135 providing electrical connections between the top and bottom conductive layers 115 and 130. The conductive vias 135 may be employed in either the top-looker or the side-looker device orientation (the two orientations will be described in greater detail below). The top conductive layer 115 includes a die attach pad 120 for attaching chip 145 onto the substrate 105. In particular, a layer of adhesive 140 may be used to attach chip 145 onto the die attach pad 120 above the substrate 105. The top conductive layer 115 also includes a wire bond pad 125 for attaching a wire bond 160, which provides an electrical connection between the chip 145 and the top conductive layer 115. Each conductive via 135 may be a small opening in different slot shapes, such as a small round opening.

The encapsulation 165 is provided to encapsulate the chip 145, the wire bond 160, and the substrate 105 or portions of the substrate 105. In one exemplary embodiment, the encapsulation 165 is used to encapsulate an APD chip. Since APD chips typically operate at high voltages, the encapsulation 165 may be a molding compound having low ionic content and high moisture resistance. In some exemplary embodiments, the encapsulation 165 may be a molding compound that provides protection to the chip 145 and the wire bond 160 without putting high stress to the wire bond 160. In some exemplary embodiments, the molding compound may be optically transparent—it does not filter or attenuate light at particular wavelengths. For example, APTEK 6100-1 A/B may be used as the molding compound. APTEK 6100-1 A/B is a two component, unfilled, water clear, rigid system designed for the encapsulation of LED chips in optoelectronic packages. It provides environmental protection and when casted may serve as the lens portion of the device, displaying excellent clarity and light transmissivity. In another example, the molding compound may have materials to attenuate, block, or filter light in certain wavelengths. For example, APTEK 6103-A/B may be used as the molding compound. APTEK 6103-A/B is a two component, unfilled, deep red, rigid system designed for the encapsulation of infrared (IR) LED chips in optoelectronic packages. It provides environmental protection and when casted may serve as the lens portion of the device, designed to be transparent to IR light while blocking out visible light.

The encapsulation 165 is shown in FIG. 1 to cover only a portion of the top surface of the substrate 105, but the encapsulation 165 may cover the entire top surface of the substrate 105 as may be required by the end application. The side surface 180 of the encapsulation 165 may be vertical, slanted, or slanted at different angles in different sections of the encapsulation. The top surface 170 (optical interface) of the encapsulation 165 may be molded as a flat surface or as a cylindrical, spherical, aspherical, dome-shaped, torroidal lens, and the like.

Figure 2:
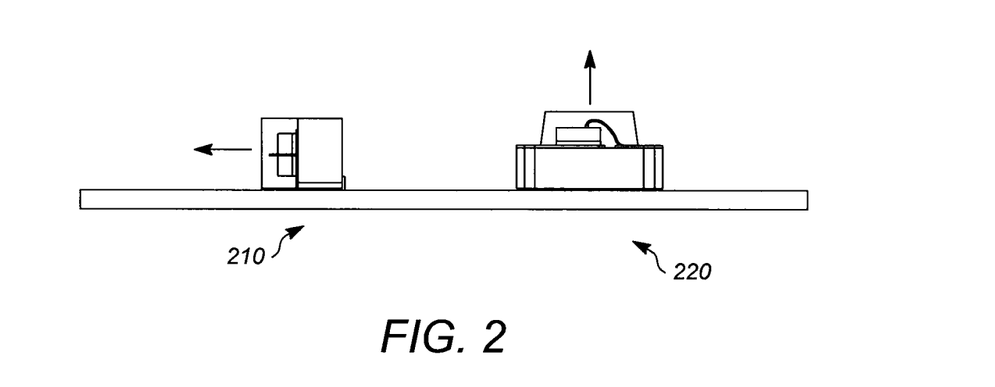
FIG. 2 illustrates an exemplary optoelectronic package mounted as a side-looker 210 or a top-looker 220 on a printed circuit board.

The optoelectronic package 100 may be mounted as a side-looker 210 or a top-looker 220 on a printed circuit board as shown in FIG. 2. In general, the orientation may be selected based on the direction of light striking on or emitting from the active area of the optoelectronic chip relative to the printed circuit board surface. For example, if the light striking on the active area of a photodiode or the light emitting from the active area of an LED is perpendicular to the printed circuit board, then a top-looker configuration may be used. In this configuration, the active area of the optoelectronic chip is parallel to the printed circuit board. Conversely, if the light is parallel to the printed circuit board, then a side-looker configuration may be used. In this configuration, the active area of the optoelectronic chip is perpendicular to the printed circuit board.

Figure 3A:
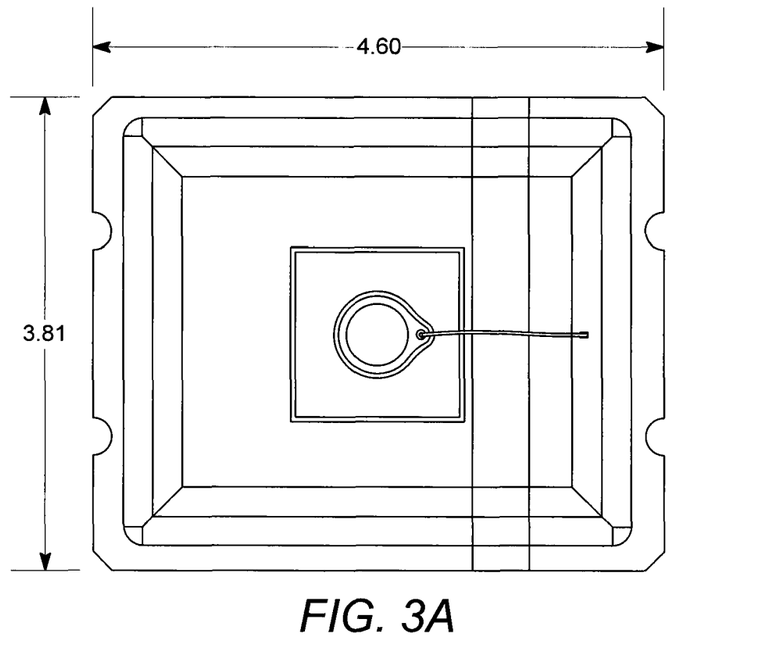
FIGS. 3A-3C illustrate the top, cross-sectional, and perspective views, respectively, of another exemplary optoelectronic package in accordance with the present invention.
Figure 3B:
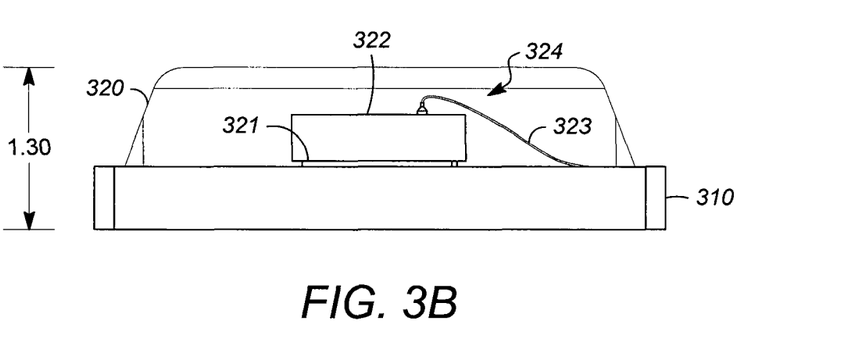
Figure 3C:
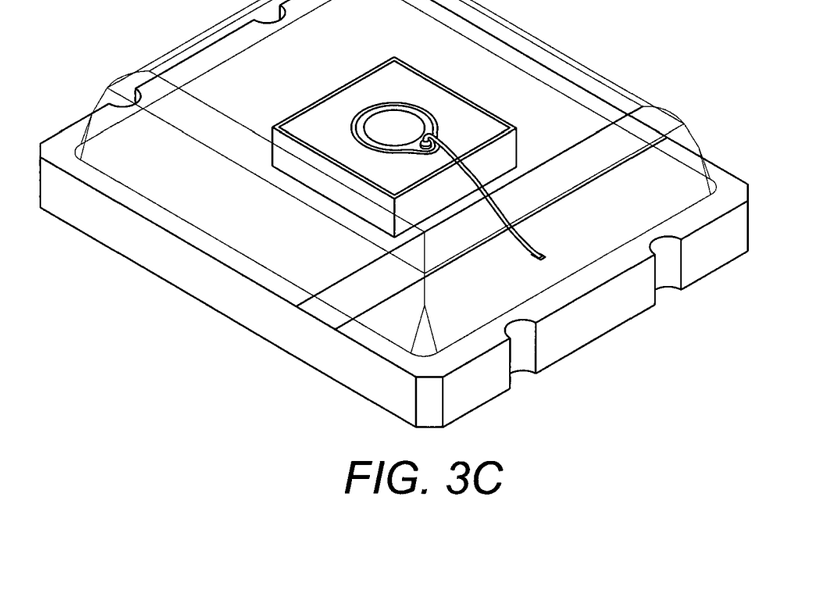
Figure 3D:
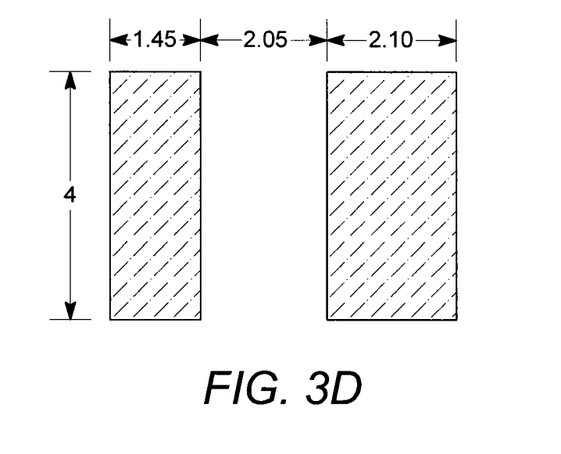
FIG. 3D illustrates exemplary mounting pads that may be used with the optoelectronic package shown in FIGS. 3A-3C.

FIGS. 3A-3C illustrate the top, cross-sectional, and perspective views respectively of another exemplary optoelectronic package in accordance with the present invention. The dimensions in the figures are in millimeters. However, it should be recognized that the dimensions provided on the figures have been provided by way of example and that other modifications may occur to those skilled in the art without departing from the scope and spirit of the present invention. As shown in FIG. 3B, substrate 310 may be a ceramic material or a printed circuit board. A side surface 320 of an encapsulation 324 is shown in FIG. 3B to be slanted at different angles in different sections of the encapsulation 324. An optoelectronic chip 322 is attached to the substrate 310 by a layer of adhesive 321. A wire bond 323 is coupled to the optoelectronic chip 322 and a wire bond pad (not shown in the figures) positioned on the top surface of the substrate. As discussed above, a leadless carrier uses flat metal pads that make contact with a printed circuit board. FIG. 3D illustrates exemplary mounting pads that may be used with the optoelectronic package shown in FIGS. 3A-3C.

Figure 4A:
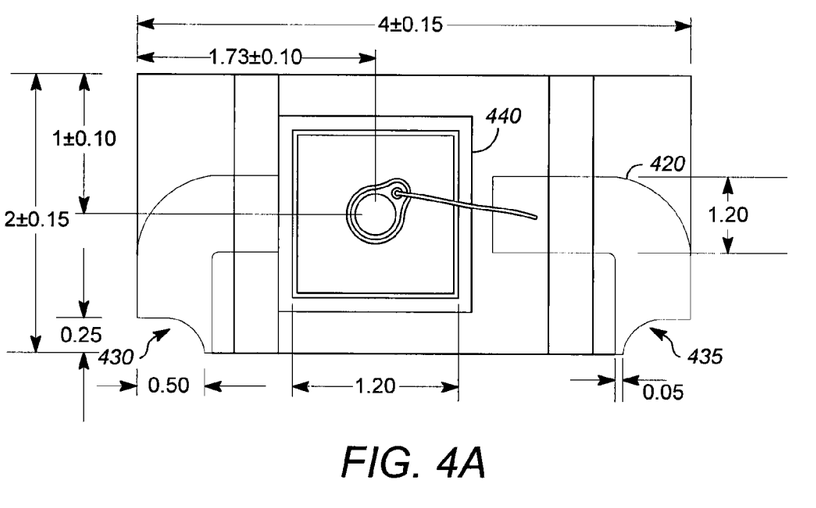
FIGS. 4A-4D illustrate the top, cross-sectional, bottom, and perspective views respectively of another exemplary optoelectronic package in accordance with the present invention. The package may be mounted as a side-looker as shown in FIG. 4E.
Figure 4B:
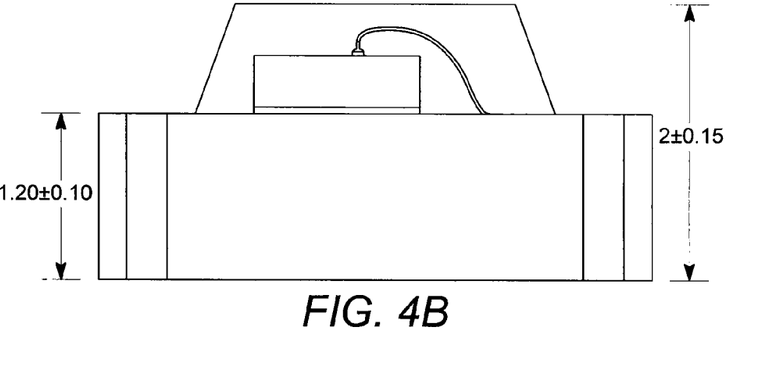
Figure 4C:
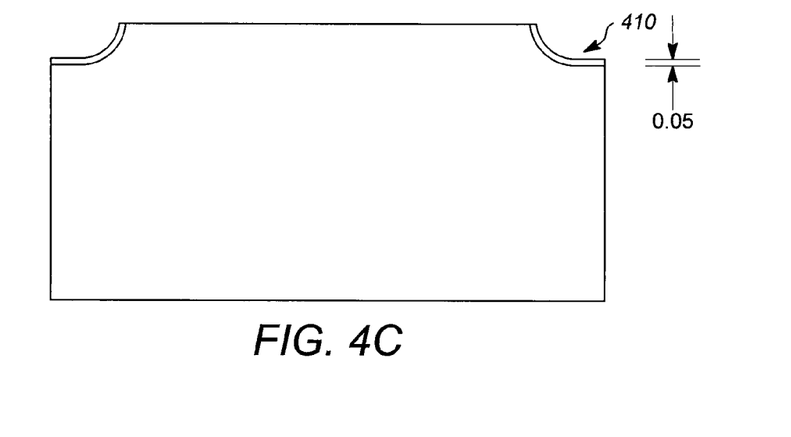
Figure 4D:
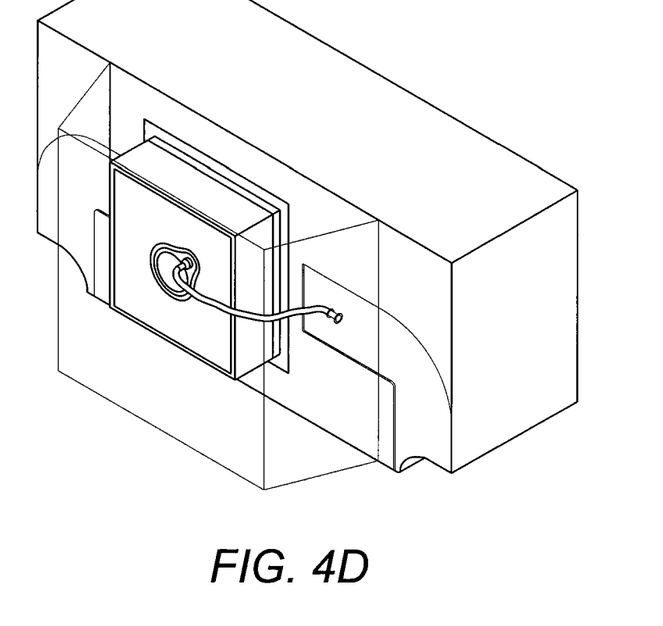
Figure 4E:
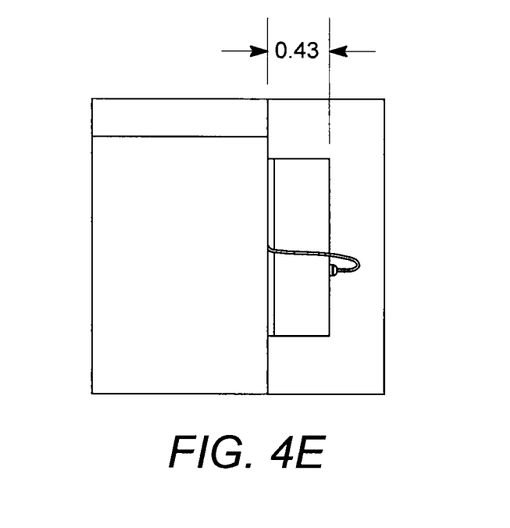

FIGS. 4A-4D illustrate the different views of an exemplary optoelectronic package in accordance with the present invention. The package may be mounted as a side-looker as shown in FIG. 4E. The dimensions in the figures are in millimeters. However, it should be recognized that the dimensions provided on the figures have been provided by way of example and that other modifications may occur to those skilled in the art without departing from the scope and spirit of the present invention. 420 is part of a top conductive layer and a portion of 420 may form a wire bond pad. 420 conducts electricity from a wire bond 440 to the solder on a printed circuit board (PCB). If the optoelectronic device is mounted as a side-looker, the slotted vias 430 and 435 may be soldered to make electrical contact with mounting pads on the printed circuit board. FIG. 4C illustrates the bottom view of the exemplary optoelectronic package. Strip 410, shown with an illustrative dimension of 0.05 millimeters, is a wrap-around metallization at the bottom side and may be made from a conductive metal layer.

Figure 5A:
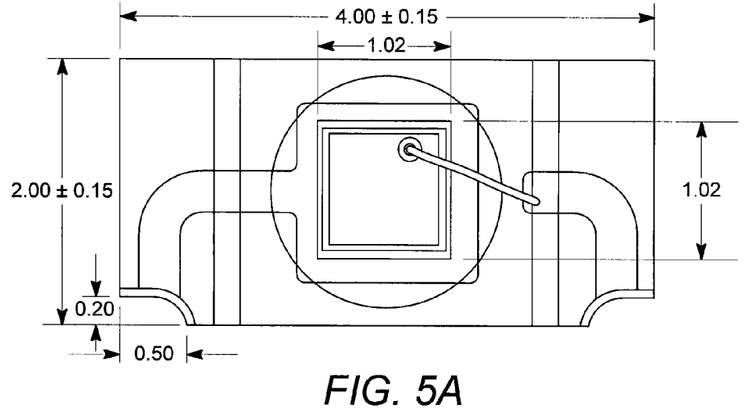
FIGS. 5A-5D illustrate the different views of an exemplary optoelectronic package with the top surface of the encapsulation molded as a dome-shaped lens. The package may be mounted as a side-looker as shown in FIG. 5E.
Figure 5B:
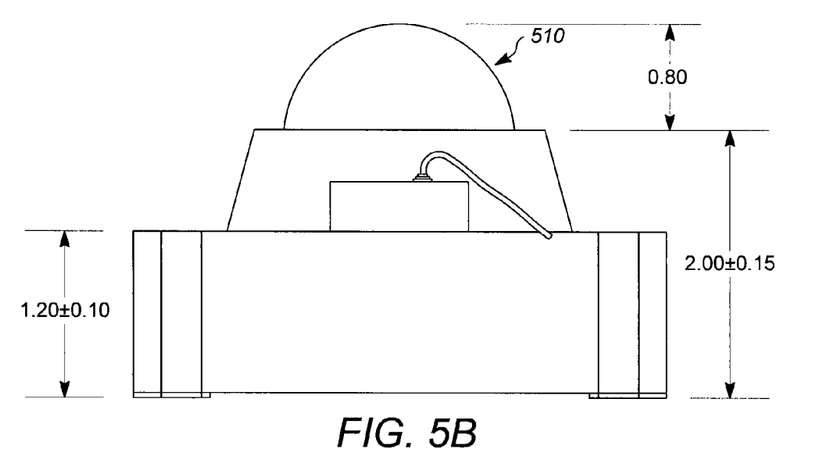
Figure 5C:
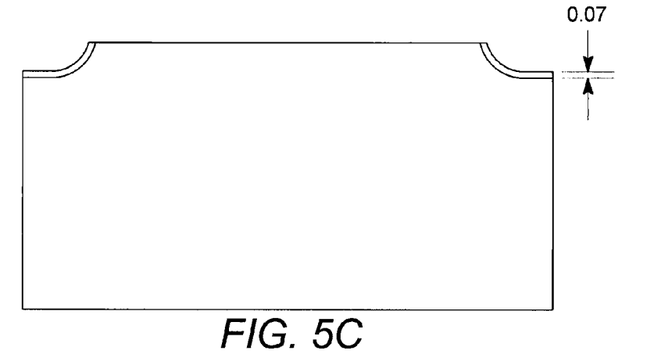
Figure 5D:
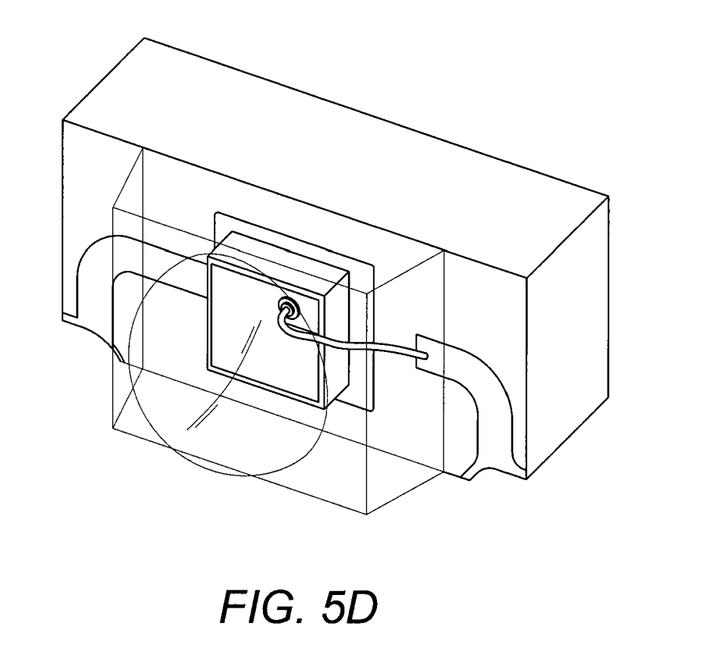
Figure 5E:
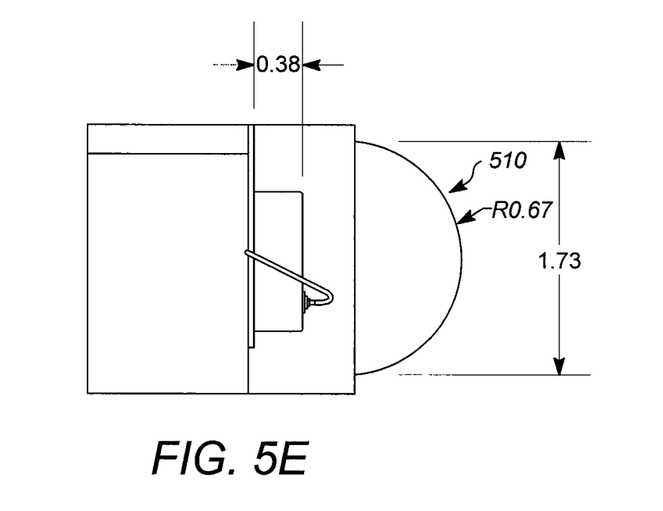
Figure 6A:
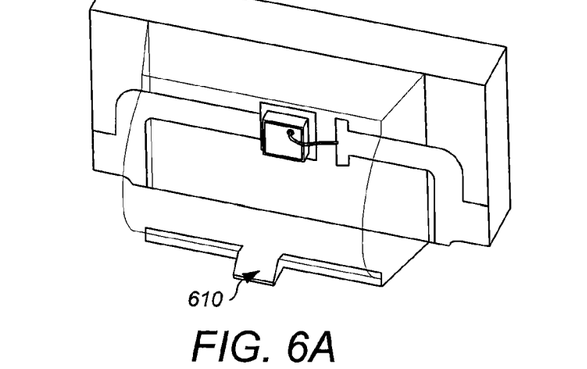
FIGS. 6A-6E illustrate the different views of another exemplary optoelectronic package with a footing and with the top surface of the encapsulation molded as a cylindrical-shaped lens.
Figure 6B:
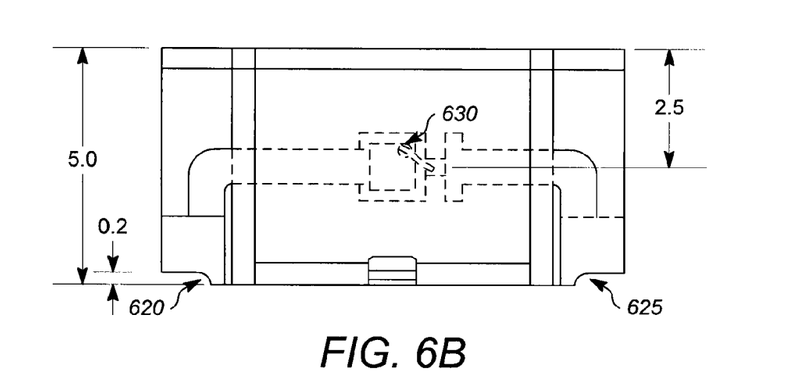
Figure 6C:
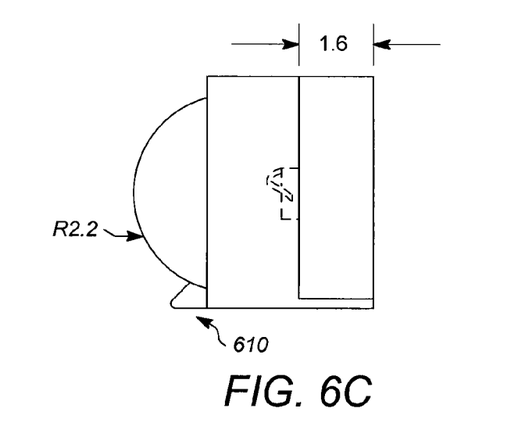
Figure 6D:
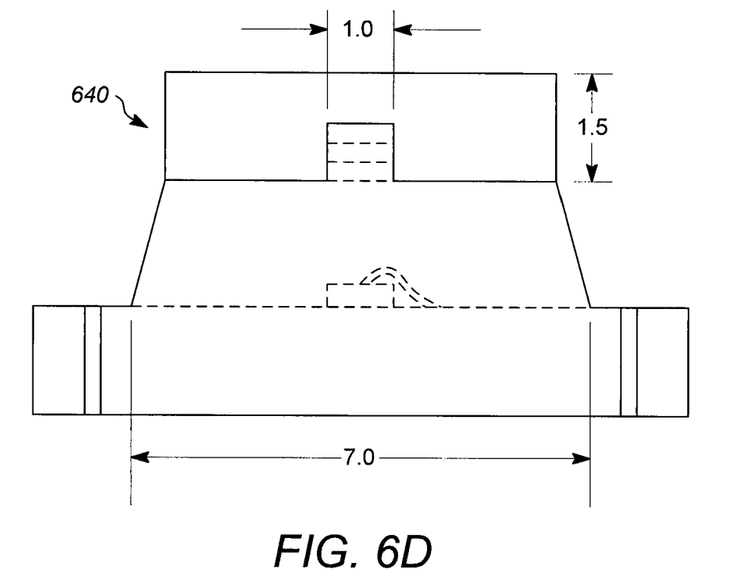
Figure 6E:
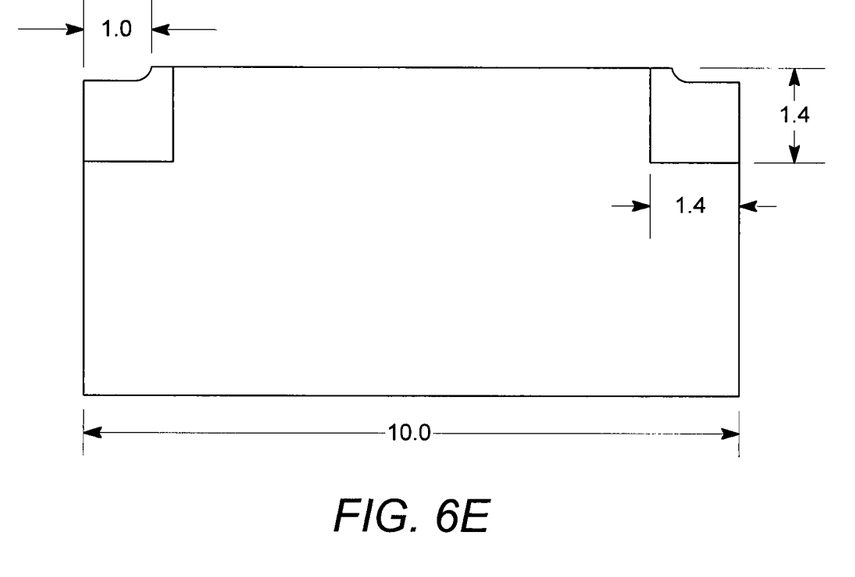

FIGS. 5A-5D illustrate the different views of an exemplary optoelectronic package with a dome-shaped lens. As shown in FIGS. 5B and 5E, the top surface 510 (optical interface) of the encapsulation may be molded as a dome-shaped lens. The package may be mounted as a side-looker as shown in FIG. 5E. FIGS. 6A-6E illustrate the different views of yet another exemplary optoelectronic package in accordance with the present invention. As shown in FIG. 6B, an optoelectronic chip is shown at 630. The slotted vias 620 and 625 may be soldered to make electrical contact with mounting pads on a printed circuit board. As shown in FIG. 6D, the top surface 640 (optical interface) of the encapsulation may be molded as a cylindrical-shaped lens. The encapsulation may include a footing 610 for stabilizing the optoelectronic package on a printed circuit board in a side-looker configuration. The footing may be made with the molding compound.

Figure 7A:
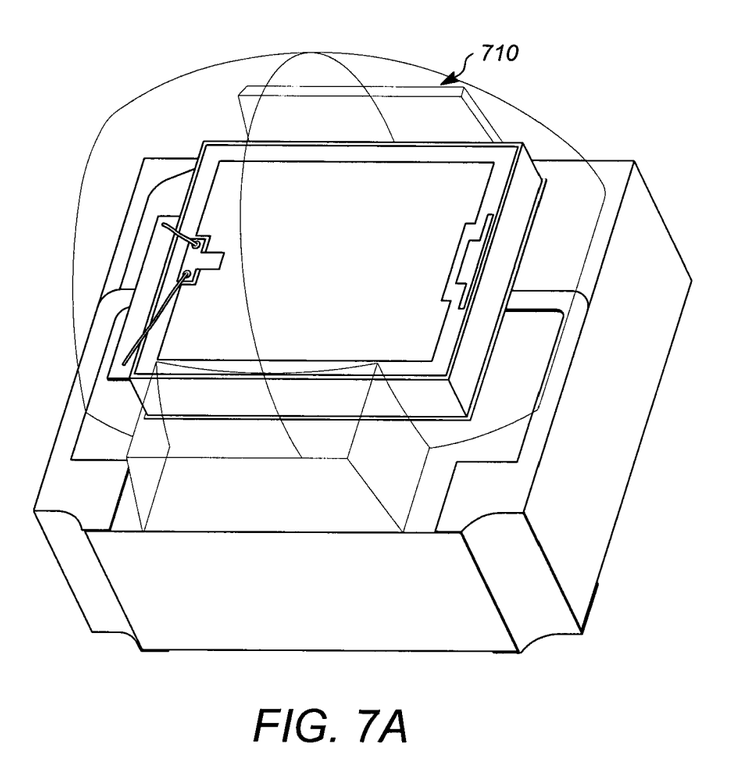
FIG. 7A illustrates an exemplary optoelectronic package with an encapsulation molded as a torroidal lens.

FIG. 7A illustrates an exemplary optoelectronic package with an encapsulation molded as a torroidal lens. A torroidal lens has different radii in different directions. For example, as shown in FIG. 7a, the top surface of the torroidal lens has a different radius of curvature compared to that corresponding to the side surface of the torroidal lens. In this example, the torroidal lens has a half-barrel shape. However, it should be recognized that the torroidal lens may have different shapes and different radii combinations. The torroidal lens shown in FIG. 7A is an illustrative example and other modifications may occur to those skilled in the art without departing from the scope and spirit of the present invention.

Figure 7B:
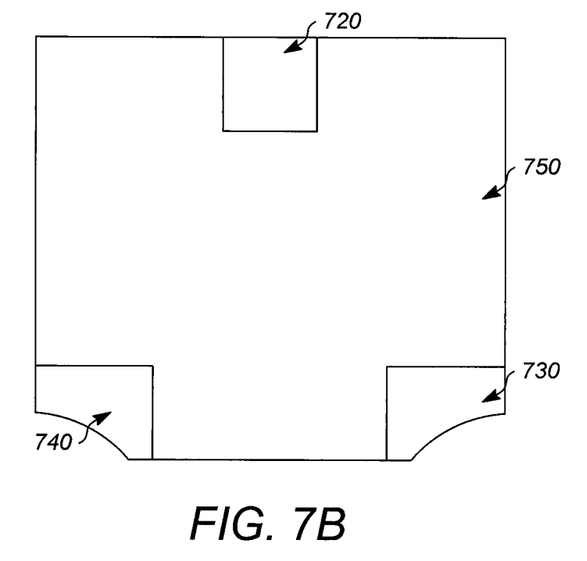
FIG. 7B illustrates the bottom view of the exemplary optoelectronic package shown in FIG. 7A.

FIG. 7B illustrates the bottom view of the exemplary optoelectronic package shown in FIG. 7A. A plurality of soldering pads, 720, 730, and 740, may be placed on the bottom conductive layer 750. In one example, the soldering pads may be gold pads; in other examples, the soldering pads may be made with other metals. If the optoelectronic package is mounted as a top-looker, the soldering pads may be soldered to make electrical contact with mounting pads on a printed circuit board. In the top-looker configuration, current may travel from the top conductive layer through conductive vias to the soldering pads and then onto the printed circuit board.

It should be recognized that in some embodiments, more than one optoelectronic chip, wire bond, or die bond pad may be placed in a single optoelectronic package. In some embodiments, the encapsulations covering the optoelectronic chips, wire bonds, and portions of the top surface of the substrate may be molded into different shapes. For example, one encapsulation may be molded as a dome-shaped lens and another encapsulation may be molded as a torroidal lens.

In some exemplary embodiments, the optoelectronic package may include an optical filter embedded within the encapsulation. In one example, an optical filter may be placed in front of the active area of an optoelectronic chip. The optical filter may be spaced apart from the active area by a layer of molding material and further enclosed by molding material to form an encapsulation.

The optical filter may be made of glass, plastic, or other materials. In one example, the optical filter may have the shape of a flat sheet. The thickness of the sheet may range from a half to one millimeter. In another example, the optical filter may be a lens of any shape. In one example, the optical filter may be transparent. In another example, the optical filter may be colored. In one example, the optical filter may be optically transparent—it does not filter or attenuate at particular wavelengths. In another example, the optical filter may attenuate, block, or filter light in certain wavelengths.

Figure 8A:
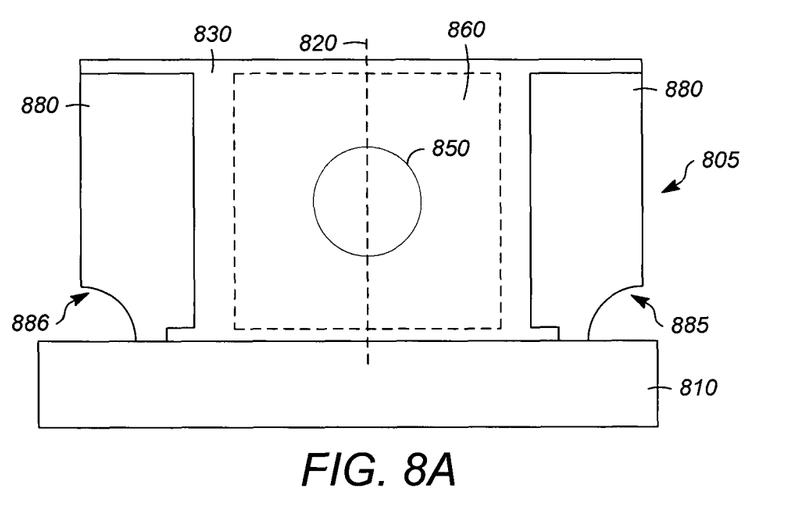
FIGS. 8A and 8B illustrate an exemplary optoelectronic package 805, wherein a chip 840 is supported by a substrate 830, and wherein the active area 845 of the chip 840 is facing the substrate 830.
Figure 8B:
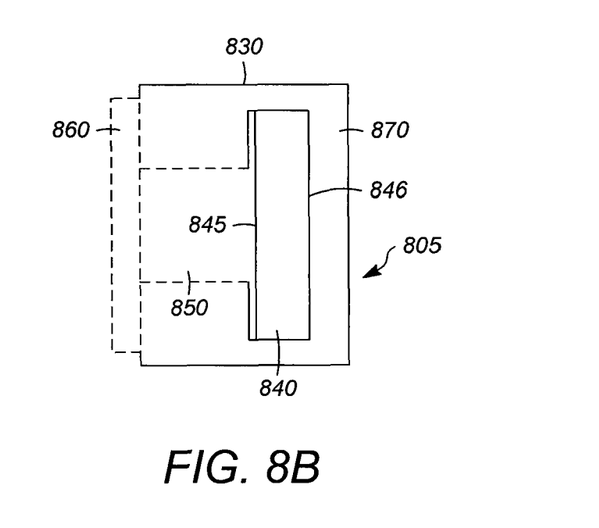

FIGS. 8A and 8B illustrate an exemplary optoelectronic package 805, wherein a chip 840 is supported by a substrate 830, and wherein the active area 845 of the chip 840 is facing the substrate 830. FIG. 8A illustrates that the exemplary optoelectronic package 805 may be mounted as a side-looker on a printed circuit board 810. FIG. 8B illustrates a cross-sectional view of the optoelectronic package 805 along axis 520 in FIG. 8A.

The optoelectronic package 805 comprises a substrate 830, a chip 840, and an encapsulation 870. Many features described for other exemplary optoelectronic packages above may also be included in optoelectronic package 805. For example, chip 840 may be any optoelectronic device; the optoelectronic package 805 may be a laminate leadless carrier (LLC); the encapsulation 870 may be a molding compound; a top conductive layer 880 may include two slotted vias 885 and 886 for soldering the top conductive layer 880 to mounting pads on the printed circuit board 810, etc.

Note that the side of the chip 840 with the active area 845, as opposed to the back side 846 of the chip 840, is attached to the substrate 830. The chip 840 may be attached to the substrate 830 using front contacts using DA epoxy. The chip 840 may utilize vias to provide front contacts, such that no wire-bonding is required. The substrate 830 has a hole 850 to allow light to reach to or from the active area 845 of the chip 840. The hole 850 may have a cylindrical shape or any other shape.

For example, the hole 850 may have a cylindrical shape with a diameter of 0.3 to 0.5 millimeter. The hole 850 may be filled with a material or it may be left empty. In one example, the hole 850 may be filled with an encapsulating material, wherein the encapsulating material may be a clear epoxy. In one example, an optical filter 860 may be placed on the substrate 830 covering the hole 850. The optical filter 860 may have any shape, size, color, or attribute as described above. The chip 840 may be covered by an encapsulation 870. The encapsulation 870 may be a molding material and it may be black, white, or clear.

Figure 9:
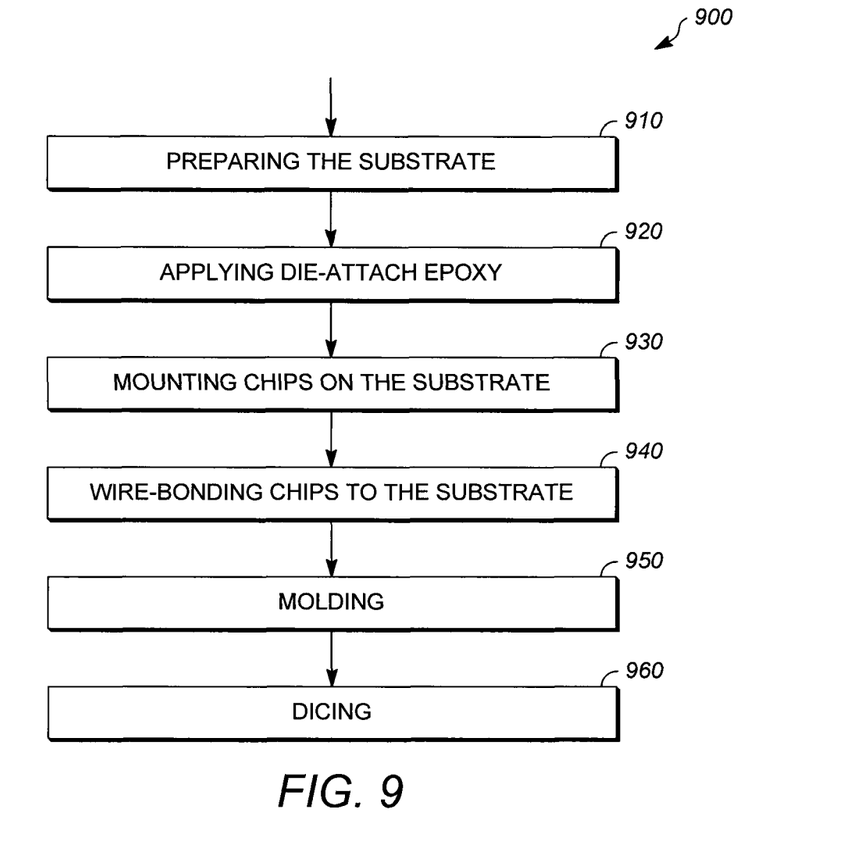
FIG. 9 shows an exemplary matrix assembly process 900 for manufacturing the optoelectronic packages described in the present application.

FIG. 9 shows an exemplary matrix assembly process 900 for manufacturing the optoelectronic packages described in the present application. As discussed earlier, the matrix assembly process is designed to meet the market demand for low cost, high volume, miniaturized, and SMT compatible products. At 910, the substrate is prepared by methods known in the art. The substrate can be, but is not limited to, a thin film ceramic substrate, a thick film ceramic substrate, and any kind of printed circuit board. At 920, die-attach epoxy is applied. The epoxy adhesive may be applied with dispensing, stamping, or printing approaches. At 930, chips such as LEDs, lasers, APDs, SiPMs, PINs, phototransistors, photodiodes, and the like are mounted on the substrate manually or using a semi-automatic or automatic die-attach machine. At 940, wire bonds are added to the substrate manually or using a semi-automatic or automatic die-attach machine. Depending on the application, the wire-bond may use different materials, such as Alumina or Gold; different sizes, such as 0.7 mils and 1 mils in diameter; or different configurations such as ball-wedge and wedge-wedge. At 950, molding compounds are added to the substrate as an encapsulation through molding. The molding compound may be poured as a liquid and then cured. The curing temperature and time depend on the molding materials, and the information can be typically obtained from the material data sheets. At 960, the substrate is diced into individual optoelectronic packages. The dicing may be done with a saw blade or laser beam.

Figure 10A:
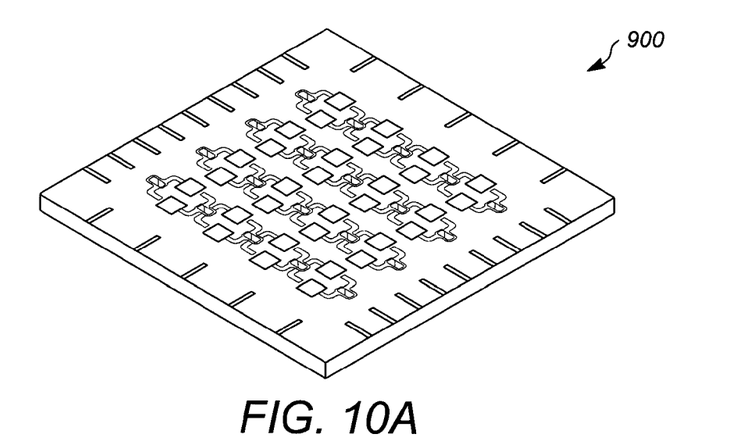
FIGS. 10A-10F illustrate a piece of substrate during different stages of the exemplary matrix assembly process 900.
Figure 10B:
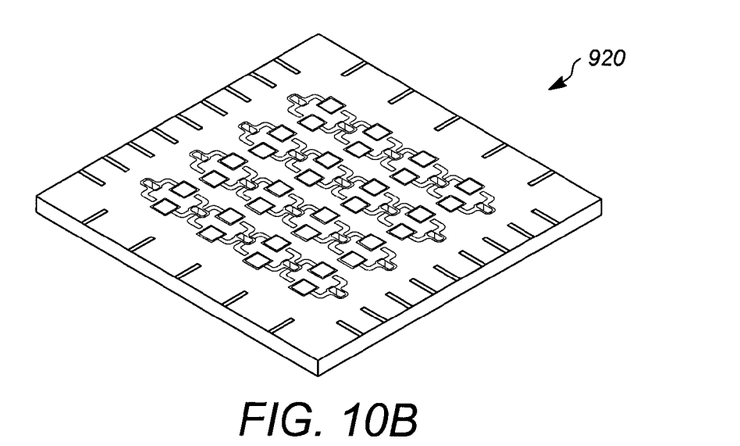
Figure 10C:
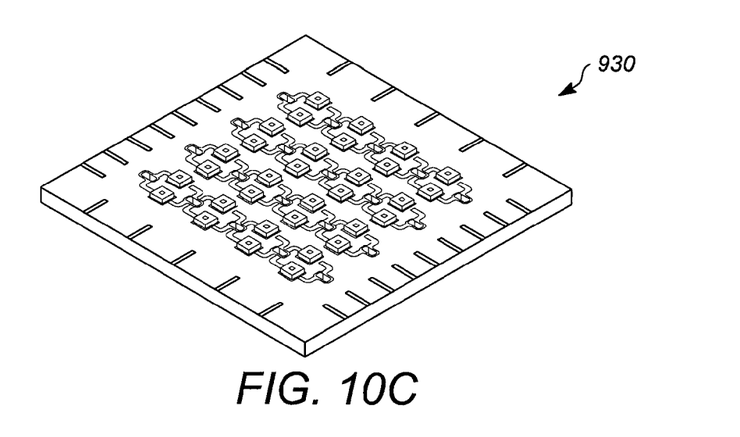
Figure 10D:
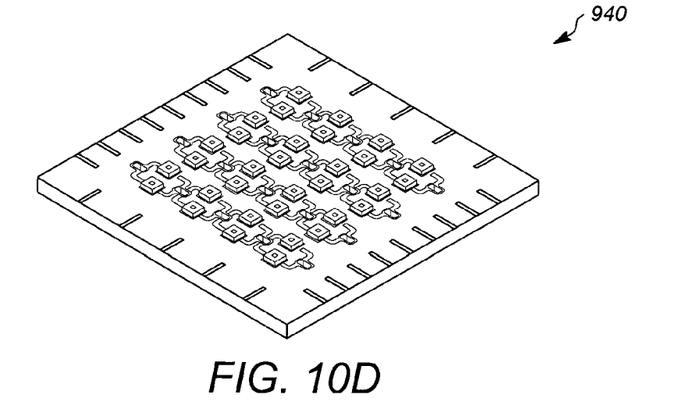
Figure 10E:
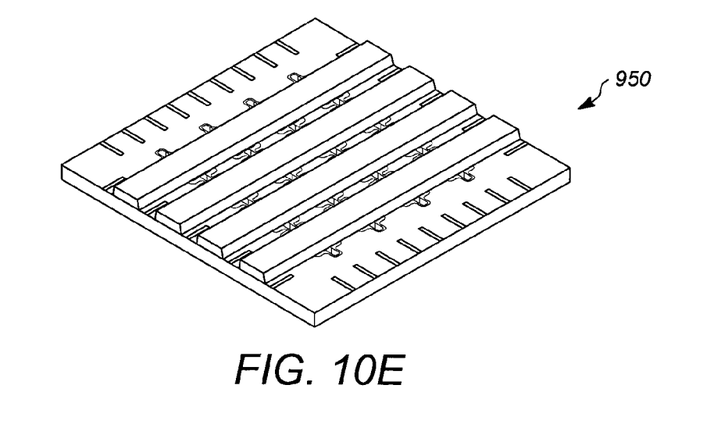
Figure 10F:
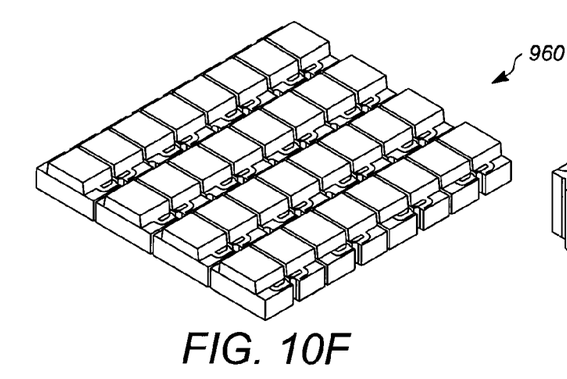
Figure 10G:
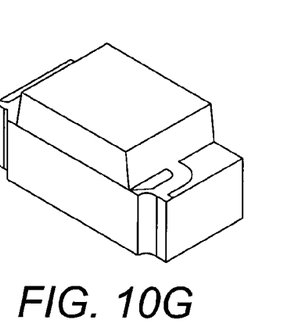
FIG. 10G illustrates an individual optoelectronic package which is the product of the exemplary matrix assembly process 900.

FIGS. 10A-10F illustrate a piece of substrate during different stages of the exemplary matrix assembly process 900 described above, and FIG. 10G illustrates an individual optoelectronic package resulted from the exemplary matrix assembly process. FIG. 10A illustrates a piece of substrate after it is prepared. FIG. 10B illustrates the assembly after the die-attach epoxy is applied. FIG. 10C illustrates the assembly after chips such as LEDs, lasers, APDs, SiPMs, PINs, phototransistors, photodiodes, and the like are mounted on the substrate. FIG. 10D illustrates the assembly after wire bonds are added to the substrate. FIG. 10E illustrates the assembly after molding compounds are added to the substrate as an encapsulation. FIG. 10F illustrates the assembly after it is diced into individual optoelectronic packages. An assembly is the integration of more than one material; it can be one package or an array of packages.

It should be recognized that process 900 can be preceded by any number of processes performed as part of an assembly process. For example, in one preceding process, the substrate may be processed with cavities and/or embosses for the chips to sit on. Also, any number of processes may be performed subsequent to process 900 as part of the assembly process. For example, in one subsequent process, the diced devices may be tested in matrix form or individually.

Although the present invention has been described in connection with some embodiments, it is not intended to be limited to the specific form set forth herein. Rather, the scope of the present invention is limited only by the claims. Additionally, although a feature may appear to be described in connection with particular embodiments, one skilled in the art would recognize that various features of the described embodiments may be combined in accordance with the invention.

Furthermore, although individually listed, a plurality of means, elements or process steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather the feature may be equally applicable to other claim categories, as appropriate.

What is claimed is:

1. A laminate leadless carrier package comprising:
   an optoelectronic chip;
   a substrate supporting the optoelectronic chip, the substrate comprising a plurality of conductive and dielectric layers laminated together including a bottom conductive layer, a top conductive layer, and a dielectric layer between the top and bottom conductive layers;
   a plurality of conductive slotted vias providing electrical connections between the top conductive layer and the bottom conductive layer;
   a wire bond pad positioned on the top surface of the substrate;
   a wire bond coupled to the optoelectronic chip and the wire bond pad;
   an encapsulation covering the optoelectronic chip, the wire bond, and at least a portion of the top surface of the substrate, wherein the encapsulation is a molding compound; and
   wherein the laminate leadless carrier package is arranged to be mounted in a side-looker configuration on a printed circuit board, wherein the active area of the optoelectronic chip is perpendicular to the printed circuit board, and the slotted vias are arranged to be in electrical contact with the brinted circuit board.

2. The laminate leadless carrier package of claim 1, wherein the optoelectronic chip is supported by the substrate without a lead-frame.

3. The laminate leadless carrier package of claim 1, wherein the top conductive layer includes a die attach pad, and wherein the optoelectronic chip is adhered to the die attach pad.

4. The laminate leadless carrier package of claim 1, wherein the wire bond pad is a portion of the top conductive layer.

5. The laminate leadless carrier package of claim 1, wherein the molding compound has low ionic content.

6. The laminate leadless carrier package of claim 1, wherein the molding compound has high moisture resistance.

7. The laminate leadless carrier package of claim 1, wherein the molding compound is optically transparent.

8. The laminate leadless carrier package of claim 1, wherein the molding compound filters light at particular wavelengths.

9. The laminate leadless carrier package of claim 1, wherein the encapsulation provides protection without putting high stress to the wire bond.

10. The laminate leadless carrier package of claim 1, wherein the encapsulation covers the entire top surface of the substrate.

11. The laminate leadless carrier package of claim 1, wherein the top surface of the encapsulation is molded as a flat surface.

12. The laminate leadless carrier package of claim 1, wherein the top surface of the encapsulation is molded as a lens.

13. The laminate leadless carrier package of claim 12, wherein the lens is selected from the group consisting of a cylindrical lens, a spherical lens, a torroidal lens, an aspherical lens, and a dome-shaped lens.

14. The laminate leadless carrier package of claim 1, wherein the encapsulation further comprises a footing for stabilizing the optoelectronic package when mounted as a side-looker.

15. The laminate leadless carrier package of claim 1, wherein the optoelectronic chip is selected from the group consisting of a laser, a light-emitting-diode (LED), a photodiode, a phototransistor, a PIN photodiode, an avalanche photodiode (APD), and a silicon photomultiplier (SiPM).

16. The laminate leadless carrier package of claim 1, wherein the substrate is selected from the group consisting of thin film ceramic substrates, thick film ceramic substrates, and printed circuit boards.

17. The laminate leadless carrier package of claim 1, further comprising an optical filter covered by the encapsulation, wherein the optical filter is positioned above the active area of the optoelectronic chip.

18. A laminate leadless carrier package comprising:
    an optoelectronic chip;
    a substrate supporting the optoelectronic chip, the substrate comprising a plurality of conductive and dielectric layers laminated together;
    a wire bond pad positioned on the top surface of the substrate;
    a wire bond coupled to the optoelectronic chip and the wire bond pad; and
    an encapsulation covering the optoelectronic chip, the wire bond, and at least a portion of the top surface of the substrate, wherein the encapsulation is a molding compound;
    wherein the laminate leadless carrier package is arranged to be mounted in a sidelooker configuration on a printed circuit board, the active area of the optoelectronic chip is perpendicular to the printed circuit board, and in a top-looker configuration on a printed circuit board, and the active area of the optoelectronic chip is parallel to the printed circuit board.

* * * * *